(12) United States Patent
Sawada et al.

(10) Patent No.: US 7,772,289 B2
(45) Date of Patent: Aug. 10, 2010

(54) COLLOIDAL CRYSTALS AND METHOD AND DEVICE FOR MANUFACTURING COLLOIDAL CRYSTAL GEL

(75) Inventors: Tsutomu Sawada, Ibaraki (JP); Toshimitsu Kanai, Ibaraki (JP); Akiko Toyotama, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 639 days.

(21) Appl. No.: 10/565,323

(22) PCT Filed: Jul. 21, 2004

(86) PCT No.: PCT/JP2004/010676

§ 371 (c)(1),
(2), (4) Date: Jan. 20, 2006

(87) PCT Pub. No.: WO2005/012960

PCT Pub. Date: Feb. 10, 2005

(65) Prior Publication Data

US 2006/0183807 A1    Aug. 17, 2006

(30) Foreign Application Priority Data

Jul. 22, 2003   (JP) .............................. 2003-199711

(51) Int. Cl.
*B01J 13/00*   (2006.01)
(52) U.S. Cl. ........................................ 516/98; 366/348
(58) Field of Classification Search .................. 422/99, 422/245.1–260; 516/98; 366/348
See application file for complete search history.

(56) References Cited

U.S. PATENT DOCUMENTS

| 5,218,370 A | 6/1993 | Blaese ........................ 264/1.1 |
| 5,898,004 A | 4/1999 | Asher et al. ................. 436/518 |
| 6,187,599 B1 | 2/2001 | Asher et al. ................. 436/531 |
| 2006/0144319 A1 * | 7/2006 | Sawada et al. ................ 117/2 |

FOREIGN PATENT DOCUMENTS

| EP | 0482394 |   | 4/1992 |
| JP | 3-504462 |   | 10/1991 |
| JP | 2002-28471 |   | 1/2002 |
| JP | 2002-028471 | * | 1/2002 |
| JP | 2002-231980 | * | 8/2002 |
| JP | 2003-212700 |   | 7/2003 |
| JP | 2003212700 | * | 7/2003 |

OTHER PUBLICATIONS

Toshimitsu Kanai, Tsutomu Sawada, Akiko Toyotama, and Kenji Kitamura, Adv. Funct. Mater, 2005, 15, No. 1, pp. 25-29.*

* cited by examiner

*Primary Examiner*—Ling-Siu Choi
*Assistant Examiner*—Bijan Ahvazi
(74) *Attorney, Agent, or Firm*—patenttm.us

(57) ABSTRACT

Prior colloidal crystal preparation means requires much workmanship to obtain colloidal crystals, relying much on the expertise of an operator. To utilize colloidal crystals in various fields and develop them from now on, it is in demand to establish preparation means capable of preparing colloidal crystals with good reproducibility. The object of the invention is to meet such demand.

A gas compressed in a compressor (1) is controlled by a gas pulse controller (3) to generate compressed air pulses, and the pulses are then guided to a colloidal crystal preparation vessel (6) having a flat plate type capillary portion to produce a pressure fluctuation, which is in turn used as driving power, thereby giving a flow and hard-stopping motion to a colloidal solution in the flat plate type capillary for formation of colloidal crystals of good single crystallinity.

4 Claims, 4 Drawing Sheets

COLLOIDAL CRYSTALS AND METHOD AND DEVICE FOR MANUFACTURING COLLOIDAL CRYSTAL GEL

ART FIELD

The present invention relates to a process for the preparation of colloidal crystals and colloidal crystal gels, both of enhanced single crystallinity, which are expected to find applications in optical element fields, and a system for carrying out that method.

BACKGROUND ART

In a colloidal solution in which fine particles with a uniform enough particle size are dispersed in a solvent (hereinafter called simply the colloidal solution), if conditions such as an increased concentration of fine particles and a decreased concentration of ions in the solvent are put in order, there is then obtained a state where the fine particles are lined up three-dimensionally and periodically into a crystal-like structure. The colloidal solution in such a state is referred to as a colloidal crystal (for instance, see non-patent publication 1). That colloidal crystal is a sort of the so-called photonic crystal (for instance, see non-patent publications 2 and 3), and found to produce a unique optical phenomenon in response to light. For this reason, attention has recently been paid to possible applications of the colloidal crystal to optical elements. Especially in consideration of practical applications to optical elements, it has now been proposed to actively cut back the fluidity of the colloidal crystal, and to fix the whole colloidal crystal with a polymer gel for that purpose (for instance, see patent publications 1 to 5 as well as non-patent publications 4 and 5).

Ordinarily, a colloidal crystal occurs in a poly-crystalline state where crystal domains of a few μm or less in size come together. In a typical prior art method so far used for the preparation of such a colloidal crystal in a single crystal form, a colloidal solution in a colloidal crystal state is poured in a narrow space between parallel surfaces, and the opposite parallel surfaces are relatively vibrated while the amplitude of that vibration is set to much the same as the space between both surfaces, thereby forming a colloidal crystal of good single crystallinity (patent publication 5).

The requirement for this method is that both plate surfaces be vibrated at a specific amplitude width, that is, in such a way that the amplitude width becomes the same as the narrow space between them. Specifically, this vibratory motion is achieved by pouring a colloidal solution between two glass plates with a gap set to 50 to 100 μm, and moving one plate relative to another by use of a stepping motor and a rectilinearly translating device. In this case, rectilinear transverse vibrations must occur precisely while the frequency of vibrations of the plates is set to a value greater than that of Brownian movement of colloid and the amplitude is set to the plate spacing.

As described above, this method should be carried out by relatively vibrating two plates at a precisely controlled minute amplitude while they are kept well parallel at a constant minute spacing; a higher degree of design than ever before is needed for setting up a system for practicing that method. In use, too, much more consistent and precise control is needed. In other words, it is not easy to design and control that system as strictly specified. If precision and conditions differ, for instance, if the amplitude width fluctuates or goes beyond a preset range, there will then be inconveniences such as much difficulty with which colloidal crystals of good single crystallinity are formed, or defective colloidal crystals. The method has another problem; to prepare colloidal crystals with this system, two plates must be relatively movable. However, the relative movement of two plates may cause destruction of the ensuing crystals; that is, impeccable timing is needed for it. Especially after the formation of crystals in the minute space in the plates, it is necessary to provide means of how a situation terribly vulnerable to vibrations is specifically overcome. In this respect, however, the prior art does not say anything sufficient.

Moreover, the prior art method requires 100 to 1,000 vibration cycles, and at a vibration period of typically about 1 Hz, the formation of crystals may occasionally take a time of more than one minute to a dozen minutes, during which the concentration of the feed solution must be kept constant, leakage must be kept back, and contact with outside air must be fully cut off. Supposing that leakage or evaporation of the dispersion occurs during the preparation of colloidal crystals, it would be difficult to ensure colloidal crystals of constant quality, offering serious troubles with reproducibility or the like. In other words, the prior art system seems to have to have some special means for them; however, there is neither reference to, nor disclosure of, how they are specifically overcome. With the prior art method that relies upon vibration shearing, there is much left to be technically desired, and it must remain to be seen what is needed for. Thus, that prior art colloidal crystal preparation method has yet to be clarified in many respects, and so seems to be hard to ensure reproducibility and far away from completion.

On the other hand, the inventors have already come up with forming colloidal crystals by resolving means quite different from that according to the aforesaid prior art, wherein plates are subjected to vibratory motion at precisely controlled, extremely minute amplitudes for vibratory shearing. More specifically according to the resolving means proposed by the inventors, a colloidal crystal preparation vessel is positioned not only in a narrow capillary space defined by parallel surfaces but also in a space including a bent passage, and a colloidal solution is pushed at a single stroke in the space including a bent passage by means of syringe operation for crystallization, as is not the case with vibratory shearing with plates subjected to motion at a minute amplitude width.

This method gives to the colloidal solution a shearing flow motion based on strong force that is excluded in the aforesaid vibratory motion method relying on minute vibrations, whereby a huge single crystal domain of as large as centimeter size is successfully formed in a flat plate type capillary instantaneously in a single operation. Applicant has filed a patent application for this method (patent publication 6). Further, Applicant has invented a colloidal single crystal preparation and storage vessel, which makes it easy to carry out this method, and a single crystallization method using it, and filed a patent application for them (patent publication 7). A series of such inventions proposed by the inventors have made it much easier to prepare colloidal crystals while the problems in association with the aforesaid prior art are eliminated.

It is here noted that the aforesaid gelling crystal is a colloidal crystal gel wherein the feed solution for colloidal crystals, to which a polymerizable monomer, a crosslinking agent and a polymerization initiator have been pre-added, is crystallized and then polymerized by heating, irradiation with light or the like to immobilize the whole colloidal crystal with a polymer gel, thereby providing an optical element that is much more stable than that placed in a before-gelling state.

Non-patent Publication 1

"Colloidal Chemistry I" edited by the Chemical Society of Japan, Tokyo Kagaku Dozin Co., Ltd., pp. 119-123 ("Colloidal Crystal" at Chapter 7, Section 7.2)

Non-patent Publication 2

"Photonic Crystal" translated by Fujii and Inoue, Corona Co., Ltd., published on Oct. 23, 2000

Non-patent Publication 3

"Dictionary of Physics and Chemistry, Fifth Edition" edited by Iwanami Shoten Co., Ltd., Chapter "Photonic Crystal", Fourth Issue, published on Apr. 25, 2000

Non-patent Publication 4

Asher et al. J. Am. Chem. Soc. Vol. 116, 1994, pp. 4997-4998

Non-patent Publication 5

Jethmalani and Ford, Chem. Matter. Vol. 8, 1996, pp. 2138-2146

Patent Publication 1

U.S. Pat. No. 5,281,370

Patent Publication 2

U.S. Pat. No. 6,187,599

Patent Publication 3

U.S. Pat. No. 5,898,004

Patent Publication 4

EP0482394A2

Patent Publication 5

Publication No. 3-504462 (Japanese Translation of PCT Internal Publication)

Patent Publication 6

JP(A) 2002-028471

Patent Publication 7

JP(A) 2003-212700

SUMMARY OF THE INVENTION

PROBLEM TO BE SOLVED BY THE INVENTION

However, the prior technologies for the preparation of colloidal crystals set forth in the publications inclusive of patent publication 5, or the colloidal crystal preparation method set forth in patent publication 6 or 7 proposed by the inventors on the basis of the prior technologies set forth in them are all found that whether or not they are successfully carried out is heavily dependent on the workmanship of those skilled in the art, and there is still a bottleneck in future developments of colloidal crystals. Such being the case, an object of the invention is to provide practical means with which, on the basis of the colloidal crystal preparation technology using a flat plate type capillary vessel and syringe manipulation as previously proposed by the inventors, an expert in the art can consistently carry out a series of operations relying exclusively upon manual manipulations, i.e., wherein a colloidal solution is strongly flowed in a flat plate type capillary, followed by hard-stopping of that flow, thereby forming colloidal single crystals, with an improved reproducibility yet without varying with the skill of the expert.

Referring here to what is meant by the above hard-stopping of the flow, as there is a continued weak shearing flow state created during a flow-reducing process, defects are often induced in the resulting colloidal crystal. Therefore, the "strong flow" and "hard-stopping" are of importance, and it is an essential key to the invention to provide technical means for ensuring such rapidly changing, vigorous motion with an improved reproducibility.

MEANS FOR SOLVING THE PROBLEM

The inventors' study after study has now lead to a discovery of promising resolving means that, by virtue of the features set forth hereinafter, enables a colloidal solution in a flat plate type capillary to be strongly flowed and hard stopped, so that colloidal crystals can be prepared with repeatability and reproducibility yet with high efficiency. That discovery has underlain the invention, and the features of the invention are now embodied as follows.

(1) A colloidal crystal preparation process, characterized in that compressed air pulses are generated by control of a compressed gas, and then guided to a colloidal crystal preparation vessel having a flat plate type capillary portion to produce a pressure fluctuation therein, which is used as driving power, thereby giving a flow and hard-stopping motion to a colloidal solution in said flat plate type capillary for formation of colloidal crystals of good single crystallinity.

(2) A process of preparation of a colloidal crystal gel having good single crystallinity, characterized in that subsequent to said step of forming colloidal crystals of good single crystallinity, a step of gelating the formed colloidal crystals is applied.

(3) A colloidal crystal preparation system, comprising compressed gas feeder means, gas pulse formation means for producing a compressed gas as short-time gas pulses, and a colloidal crystal preparation vessel having a flat plate type capillary portion for formation of colloidal crystals.

(4) A colloidal crystal gel preparation system, comprising compressed gas feeder means, gas pulse formation means for producing a compressed gas as short-time gas pulses, a colloidal crystal preparation vessel having a flat plate type capillary portion for formation of colloidal crystals, and gelation acceleration means.

Here the term "compressed gas pulses" or "gas pulses" is defined as a gas always precisely released out of a pressure tank storing therein a gas compressed to a pressure higher than atmospheric pressure, a compressed gas feeder port provided in an existing setup or the like by mechatronics means, i.e., mechanical-electrical control means only over a constant, relatively short-time period, and so must be distinguished from a manually generated gas having large fluctuations. The word "pulses" is used to express that a portion affected by the aforesaid released gas is temporarily brought into a constant, short-time high pressure state by a gas release so that pressure fluctuations are created before and after that. In other words, insofar as the invention is concerned, that word means that the pressure acting on a colloidal solution in a capillary space is kept at a precise, high-pressure value temporarily over a constant time by a gas released in precise time and precise amount by means of such a compressed gas control mechanism as illustrated in the accompanying drawings or described herein.

Such pressure fluctuations may somehow be achieved by manual operation. For instance, even manual syringe operation may temporarily bring pressures acting on a colloidal solution up to high values. However, such manual operation does not have any means for setting pressure, duration, etc. to given values and, no matter what, depends on the workmanship of an operator; it varies each time and lacks in precision and reproducibility. Thus, any manual operation is inappropriate for the invention, and so must make difference from the operation for the invention.

Referring to the type of the gas used, gases that cause unpreferable reactions with the colloidal solution used or are selectively absorbed in it should be excluded. Otherwise, any limitation is basically not placed on the type of the gas used, because the gas is used for the purpose of generating pressure with respect to a colloidal solution for which water or a chemically stable organic solvent is used as a dispersing liquid. By way of example but not by way of limitation, air, nitrogen, and argon could be mentioned in view of economical and stability considerations. Air could be used in a form compressed to about 8 atm by an air compressor (usually called a compressor) and used as a primary pressure source to create gas pulses, and nitrogen and argon could be available in the form of a gas cylinder. A gas cylinder has a standard pressure of about 150 atm; it should preferably be reduced down to about a few atm by a reduction valve for a primary pressure source for the creation of gas pulses. Alternatively, a compressed air feeder port, a nitrogen feeder port or the like provided at factories or laboratories could be used as the primary pressure source.

Referring then to how to generate the gas pulses from the aforesaid primary pressure source, a compressed gas is guided from the primary pressure source to a regulator (called a pressure-reducing valve or a pressure-regulating valve) via a pressure-resistant pipe, where its pressure is allowed to go down to a desired constant pressure value. Then, a constantly closed type electromagnetic value is temporarily opened to release the gas over a short-time period, so that the gas pulses can easily be generated. In this case, if the opening time interval of the electromagnetic valve is controlled by suitable means such as a timer, it is then possible to create pulses at a precise time interval.

FIG. 1 is illustrative of one basic, exemplary pressure circuit where the air stored in a pneumatic tank is used as the primary pressure source by means of an air compressor. A portion comprising the compressor and pneumatic tank could be replaced by the above other primary pressure source. An element equivalent to the regulator or electromagnetic valve of FIG. 2, including a control mechanism for its precise control, is commercially available. For instance, equipment for controlling the opening and closing of the electromagnetic valve to a precise time interval with the use of an electronic circuit is now on the market. If that equipment is purchased and assembled into a compressed gas control mechanism for regulating gas pressure to a predetermined pressure value, then a compressed gas pulse generator can easily be designed.

As shown typically in FIG. 2, a change in the pressure of the gas pulse generated by the aforesaid pressure circuit is made up of a pressure rise phase, a constant pressure phase, and a pressure drop phase. The pressure rise phase is indicative of a pressure change upon the electromagnetic valve turning from closing to opening, the constant pressure phase is indicative of a pressure with the electromagnetic valve remaining closed (a set pressure value for the regulator), and the pressure drop phase is indicative of a pressure change upon the electromagnetic valve turning from opening to closing. Corresponding to the pressure profile shown in FIG. 2, the colloidal solution driven by the gas pulse starts to flow at the pressure rise phase, and the flow becomes strongest at the constant pressure phase, followed by hard stopping at the pressure drop phase. The time duration of each of the pressure rise phase and the pressure drop phase determined by the opening and closing of the electromagnetic valve is usually as short as the order of one one-hundredth of a second, and so the hard stopping of the flow is achievable. Gas pulse control is carried out by changing the settings for pressure value and duration at the aforesaid constant pressure phase. The optimum values for them are not generally specified because of varying with the viscosity of the colloidal solution used, capillary size, etc. Typically, however, the pressure value (pressure in excess of the standard atmospheric pressure) ranges from about 0.1 atm to about 1 atm, and the duration ranges from about 0.1 second to about 10 seconds.

The gelation acceleration means recited in (4) could be any means for allowing a high-molecular gelation agent previously added to the colloidal solution to start to gel. For instance, thermal means or light irradiation means could be used.

ADVANTAGES OF THE INVENTION

All colloidal crystal preparation means used so far in the art require some considerable workmanship, offering problems in conjunction with productivity and reproducibility. For this reason, the preparation of colloidal crystals must still rely upon those skilled in the art. The present invention makes it possible to prepare colloidal crystals with an improved reproducibility yet without depending on those experts. To add up to this, difficult-to-achieve automation and, hence, industrially efficient preparation is feasible. The invention is expected to make further improvements in colloidal crystal preparation technologies, and is of great significance. The present invention would thus encourage applications of colloidal crystals as new technical tools not only in the optical field but also in other fields, contributing more to developments of various industries.

BRIEF DESCRIPTION OF THE DRAWINGS

In FIG. 3, reference numeral 1 is a compressor, 2 a tube, 3 a gas pulse controller, 4 a tube, 5 a syringe, 6 a flat plate type capillary vessel, and 8 a reservoir.

BEST MODE FOR CARRYING OUT THE INVENTION

Figure 1:
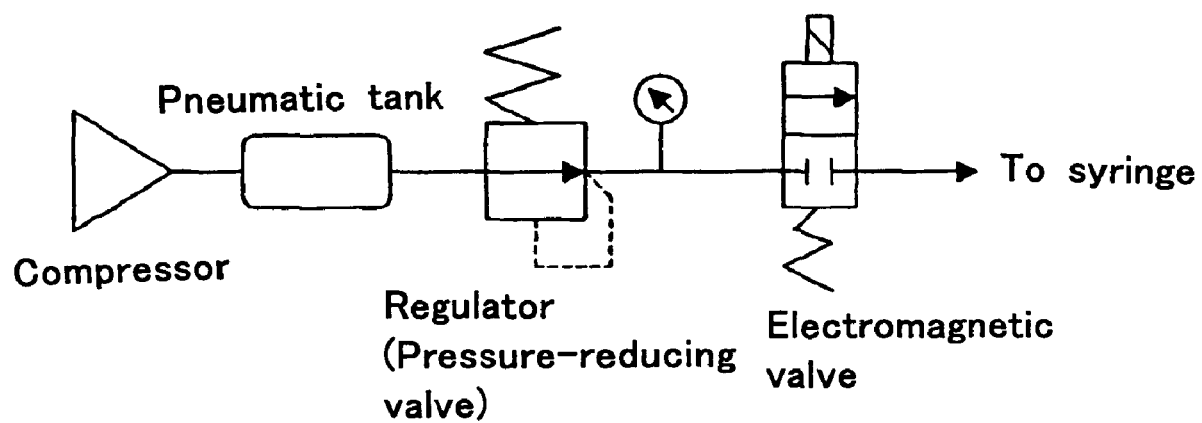
FIG. 1 is illustrative of a pressure circuit for a compressed gas pulse generator in the colloidal crystal preparation system of the invention.
Figure 2:
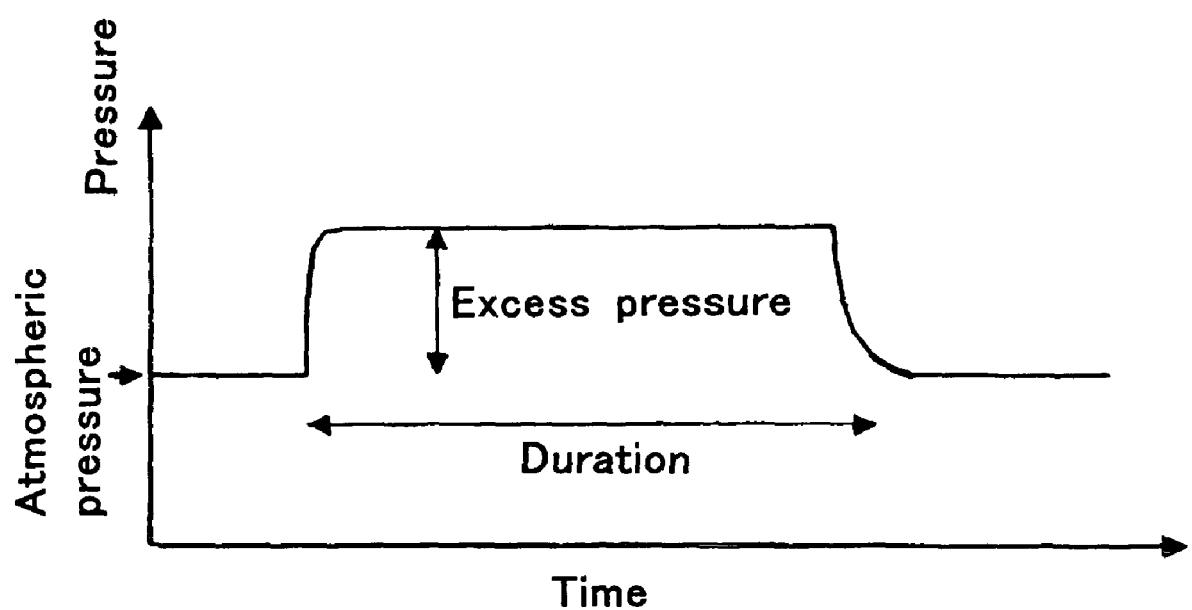
FIG. 2 is illustrative of a pressure change in a compressed gas pulse.
Figure 3:
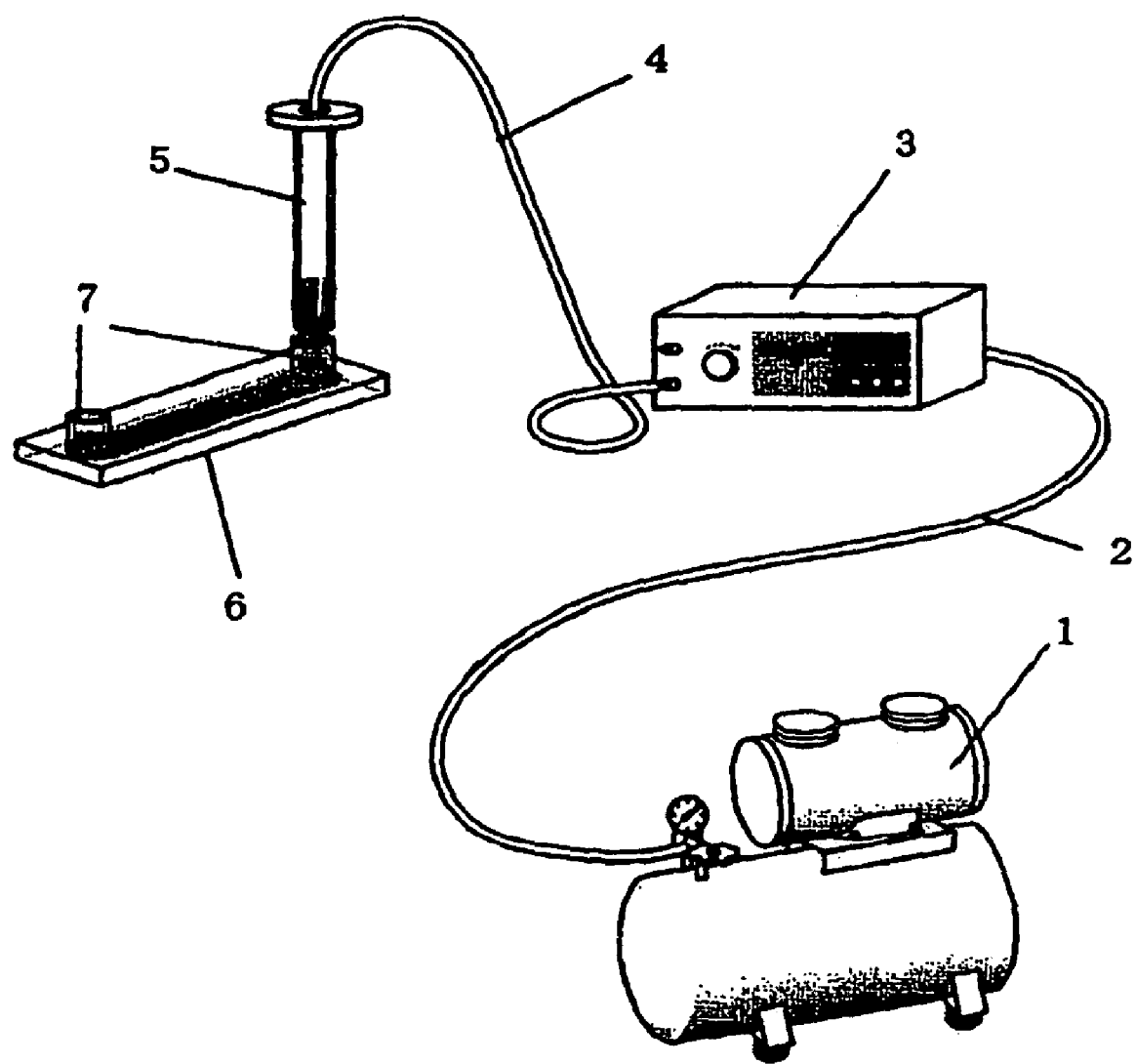
FIG. 3 is illustrative of the whole arrangement of the colloidal crystal preparation system.

Some embodiments of the invention are now explained with reference to the accompanying drawings. FIG. 3 is illustrative of the whole arrangement of the colloidal crystal preparation system. An output of the compressor 1 used as the compressed gas feeder means is entered in the gas pulse controller 3 by way of the tube 2. For this gas pulse controller, equipment for producing output pulses at a preset maximum pressure and time interval is now on the market. For instance, there is commercially available an air type dispenser controller made by Musashi Engineering Co., Ltd. (Model ML-606GX). The output pulses are applied to the flat plate type capillary vessel 6 with colloidal crystals filled in it via the tube 4 connected at a distal end with the syringe 5 (see JP(A) 2003-212700).

Here the flat plate type capillary vessel 6 has a flat plate type capillary portion provided at both its ends with cylindrical reservoirs 7 (that also work as a liquid sample inlet and outlet, so that colloidal crystals flow in the flat plate capillary portion under the pressure of gas pulses while a part of colloidal crystals in the reservoirs is prevented from entering the flat late type capillary portion to create voids.

Alternatively, if gas pulses are applied to colloidal crystals placed in the syringe 5, filling of colloidal crystals in the flat plate type capillary vessel 6 and their single crystallization by flowing can then take place at the same time. Thus, the short-time application of gas pulses enables colloidal crystals of good single crystallinity to be instantaneously formed in the flat plate type capillary.

For instance, when polystyrene particles of about 200 nm in diameter dispersed in water at a volume fraction concentration of about 10% were used as colloidal crystals along with a flat plate type capillary having a capillary flow passage size of 0.1 mm in height (passage gap), 9 mm in width and 70 mm in length, a pulse maximum pressure of about 0.1 atm to about 0.2 atm and a time interval of about 0.5 second to about 1 second were found to be proper conditions.

Alternatively, with a flow passage sized to a height of 0.2 mm, a width of 9 mm and a length of 70 mm, a pulse maximum pressure of about 0.2 atm to about 0.3 atm and a time interval of about 0.1 second to about 0.2 second were found to be proper conditions. However, those proper pulse conditions vary depending on colloidal crystal states and capillary size.

Of importance to the process of the invention is that with driving power used as compressed gas pulses ensuring easy, quantitatively accurate control of maximum pressure and time interval, optimum conditions can readily be determined through some trials and errors, and once the optimum conditions have been found, operations can then be repeated with high reproducibility. While an operator could semiautomatically carry out those operations while reading various gauge meters (not shown) mounted on the colloidal crystal preparation system, it is understood that once the optimum conditions have been found through such operations, the system can be automatically run in such a way that all the operations are automatically controllable.

As the flat plate type capillary vessel with colloidal crystals formed therein with good single crystallinity is sealed up at the ports 7, it allows the vessel to be used as an optical element in its entirety. However, since colloidal crystals are a sort of liquid, the crystal state of such an optical element is susceptible to change and deteriorate with time. To stabilize the crystal state, gelation is carried out subsequent to the single crystallization. In one possible embodiment for this, a polymerizable monomer (e.g., acrylamide), a crosslinking agent (e.g., methylene-bis(acrylamide)) and a photopolymerization initiator (e.g., camphorquinone) are previously added into colloidal crystals, which are then irradiated with light for gelation. In this case, too, if the vessel is sealed up at the ports 7 after gelation as described above, it could then be used as an optical element in its entirety. However, if the vessel is designed to be dismantled, the ensuing colloidal crystal gel could be taken out of it for later utilization. While one example of gelation by light irradiation has been described, it is understood that no particular limitation is on gelation acceleration means; gelation means or gelation acceleration means all known in the art could be used in various forms.

The process of preparing colloidal crystals with the system of the invention is now explained with reference to one example. However, it is noted that this example is provided as an aid to a better understanding of the invention, not by way of limitation.

Example 1

For a colloidal solution, there was provided a dispersion in which polystyrene particles of 198 nm in diameter (Product No. 5020B made by Duke Scientific Co., Ltd.) were dispersed in water at a volume fraction particle concentration of about 10%. This solution was allowed to coexist with an ion exchange resin (Product No. AG-501X-8(D) made by Bio-Rad Co., Ltd.) in a vial, thereby fully desalting it into a colloidal crystal state. The colloidal solution in this crystal state was then flowed at a pulse pressure of 0.15 atm and a pulse duration of 0.5 second using the above preparation system comprising a flat plate type capillary of quartz glass having a flow passage sized to a height (passage gap) of 0.1 mm, a width of 9 mm and a length of 70 mm for the formation of colloidal crystals of high single crystallinity in the flat type capillary.

Figure 4:
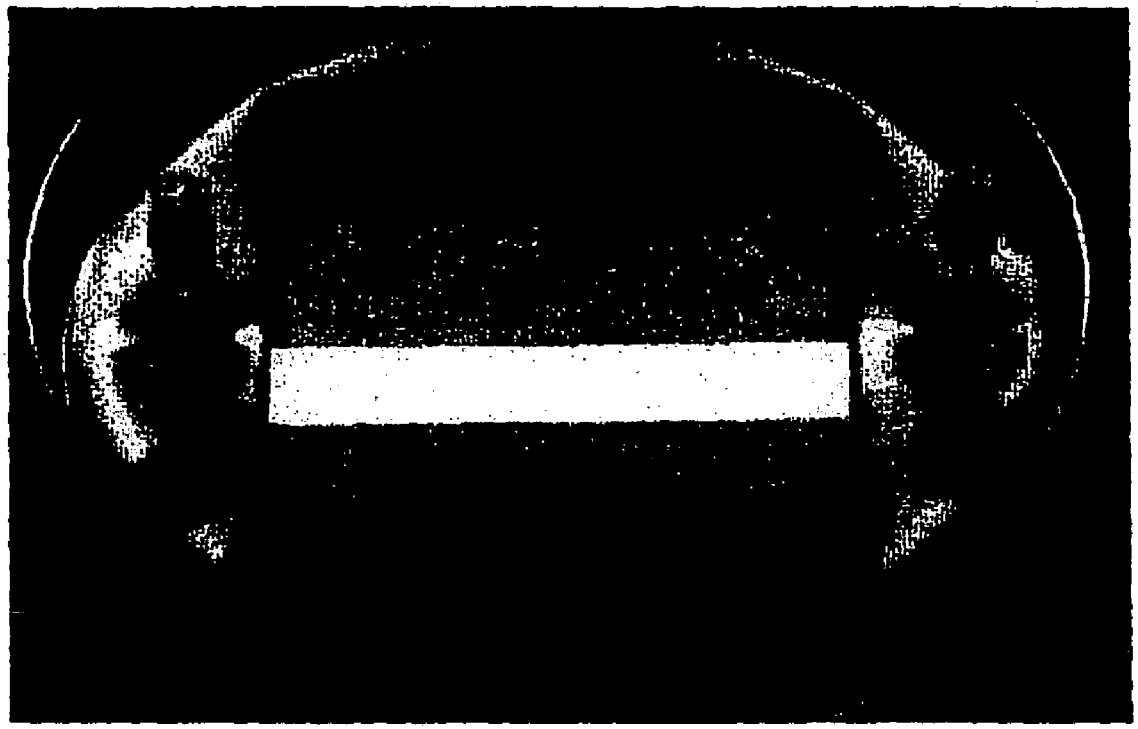
FIG. 4 is illustrative of how colloidal crystals are created as prepared according to the inventive process (photograph).

The obtained colloidal crystals were illuminated with white light (from a fluorescent lamp) to take a photograph of them under such conditions as to capture Bragg reflected light from a lattice plane parallel with the capillary substrate surface. This photograph is attached hereto as FIG. 4. Referring specifically to the photographic conditions, the whole capillary cell with colloidal crystals placed in it was immersed in a water-filled laboratory dish with a glass right-angle prism of 50×50×70.7 mm placed over it to take a clear-cut picture of Bragg reflected light from the colloidal crystals while preventing reflection of light from a glass surface that was capillary substrate surface. As can be seen from FIG. 4 (photograph), the colloidal crystals in the capillary, irradiated with white light, glow in the red monochromatic color that satisfies Bragg reflection condition (a white band in FIG. 4). Crystal color varies with changes in the angle of illumination light and the taking angle according to Bragg reflection condition. In any case, however, the sample glows evenly in monochromatic color substantially all over the surface. This shows that high single crystallinity is achieved all over the region of the colloidal crystal. Following Example 1, other samples were used with the above preparation system to prepare colloidal crystals. Consequently, improved single crystal states were found as in Example 1, well proving the effectiveness of the invention.

POSSIABLE APPLICATIONS TO THE INDUSTRY

In recent years, concern has been directed to colloidal crystals; however, any satisfactory colloidal crystal preparation process has been unavailable as yet. Colloidal preparation has still relied much on expertise, and mass production means of good reproducibility has yet to be established. For this reason, utilization as well as research and development of colloidal crystals must still rely on skilled persons, rendering it difficult to obtain high-quality colloidal crystals at low costs and, hence, posing obstacles to the utilization and development of colloidal crystals. The present invention makes it possible to prepare colloidal crystals with an improved reducibility yet without depending on those experts. To add up to this, difficult-to-achieve automation and, hence, industrially efficient preparation is feasible. The invention is expected to make further improvements in colloidal crystal preparation technologies, and is of vital significance. The present invention would thus encourage applications of colloidal crystals as new technical tools not only in the optical field but also in other fields, contributing more to developments of various industries.

What we claim is:

1. A colloidal crystal preparation process, comprising the steps of:
   forming a gas pulse from a compressed gas by using gas pulse formation means and outputting the formed gas pulse; and
   applying the gas pulse to a colloidal crystal preparation vessel having a flat plate capillary portion, wherein a colloidal solution filled in the flat plate capillary portion is made to flow at a pressure rise phase and a constant pressure phase of the applied gas pulse, and the flow of the colloidal solution is stopped at a pressure drop phase of the applied gas pulse.

2. A colloidal crystal gel process, comprising the steps of:
   forming a gas pulse from a compressed gas by using gas pulse formation means and outputting the formed gas pulse;
   applying the gas pulse to a colloidal crystal preparation vessel having a flat plate capillary portion, wherein a colloidal solution containing high-molecular gelation agent filled in the flat plate capillary portion is made to flow at a pressure rise phase and a constant pressure phase of the applied gas pulse, and the flow of the colloidal solution is stopped at a pressure drop phase of the applied gas pulse; and
   gelating the high-molecular gelation agent in the colloidal crystal containing high-molecular gelation agent obtained through the gas pulse applying step.

3. A colloidal crystal preparation system, comprising:
   compressed gas feeder means;
   gas pulse formation means for forming a gas pulse from the compressed gas fed by the compressed gas feeder means and outputting the formed gas pulse; and
   a colloidal crystal preparation vessel having a flat plate capillary portion that receives application of the gas pulse to form a colloidal crystal, wherein the gas pulse formation means forms a gas pulse whose pressure rise phase and constant pressure phase make a colloidal solution to flow and whose pressure drop phase stops the flow of the colloidal solution and outputs the formed gas pulse.

4. A colloidal crystal gel preparation system comprising:
   compressed gas feeder means;
   gas pulse formation means for a gas pulse from the compressed gas fed by the compressed gas feeder means and outputting the formed gas pulse; and
   a colloidal crystal preparation vessel having a flat plate capillary portion that receives application of the gas pulse to form a colloidal crystal containing high-molecular gelation agent; and
   gelation acceleration means, for gelating the high-molecular gelation agent in the colloidal crystal, wherein
   the gas pulse formation means forms a gas pulse whose pressure rise phase and constant pressure phase make a colloidal solution to flow and whose pressure drop phase stops the flow of the colloidal solution and outputs the formed gas pulse.

* * * * *